(12) United States Patent
Yamada

(10) Patent No.: US 8,112,183 B2
(45) Date of Patent: Feb. 7, 2012

(54) SUBSTRATE PROCESSING APPARATUS AND SUBSTRATE PROCESSING METHOD

(75) Inventor: Tomoyuki Yamada, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 315 days.

(21) Appl. No.: 12/260,211

(22) Filed: Oct. 29, 2008

(65) Prior Publication Data

US 2009/0192652 A1 Jul. 30, 2009

(30) Foreign Application Priority Data

Jan. 25, 2008 (JP) ................................. 2008-014529

(51) Int. Cl.
*G06F 19/00* (2011.01)
(52) U.S. Cl. ....................... 700/282; 700/289
(58) Field of Classification Search .................. 700/282, 700/289
See application file for complete search history.

(56) References Cited

U.S. PATENT DOCUMENTS

| | | | | |
|---|---|---|---|---|
| 4,241,010 A * | 12/1980 | Baran | ................................. | 422/2 |
| 5,873,388 A * | 2/1999 | Carpenter | ................ | 137/624.15 |
| 6,328,864 B1 * | 12/2001 | Ishizawa et al. | ......... | 204/298.01 |
| 6,701,223 B1 * | 3/2004 | Rachford et al. | ............. | 700/301 |
| 7,073,524 B2 * | 7/2006 | Chian | ............................... | 137/1 |
| 2004/0011468 A1 * | 1/2004 | Hirose et al. | ............. | 156/345.52 |
| 2007/0213864 A1 * | 9/2007 | Iijima | ............................ | 700/121 |
| 2009/0074984 A1 * | 3/2009 | Shimizu et al. | ................ | 427/569 |

* cited by examiner

*Primary Examiner* — Michael D Masinick
(74) *Attorney, Agent, or Firm* — Brundidge & Stanger, P.C.

(57) ABSTRACT

A substrate processing apparatus detects malfunction of mechanisms in MFC. An inert gas supply line, a first shut-off valve shutting off the inert gas supply, a process gas supply line, and a second shut-off valve shutting off the process gas supply are installed upstream of the MFC. A gas supply pipe connected to a process chamber, a third shut-off valve shutting off gas supply to the gas supply pipe, an exhaust vent line which is exhaustible, and a fourth shut-off valve shutting off gas supply to the exhaust vent line are installed downstream of the MFC. A main control unit determines that the MFC is abnormal if a transition time exceeds a previously set time when the MFC transitions from a closed state to an opened state while the shut-off valves are in a closed state.

2 Claims, 5 Drawing Sheets

REFERENCE POINT CHECKING PROCESS
S10

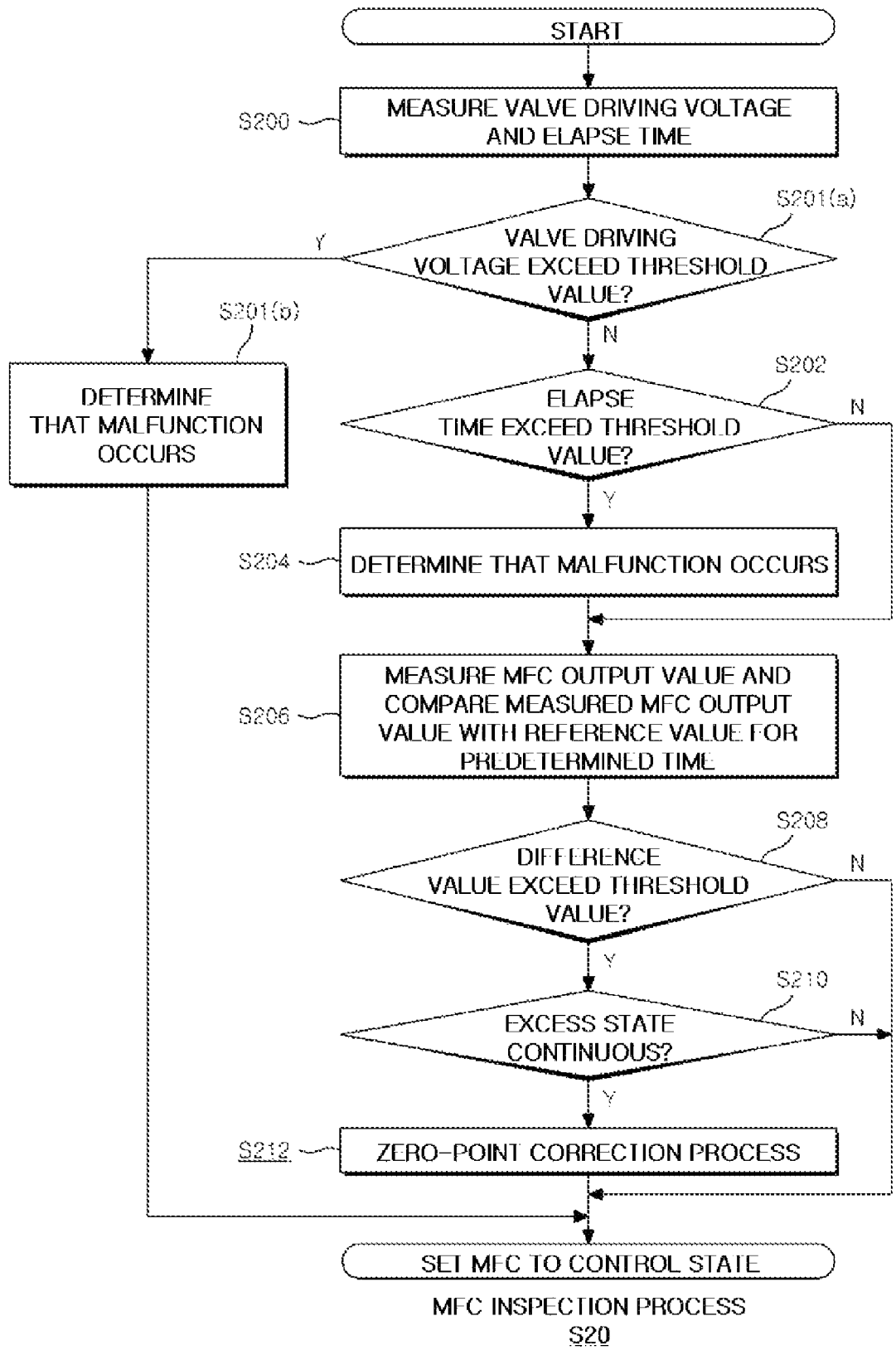

SUBSTRATE PROCESSING APPARATUS AND SUBSTRATE PROCESSING METHOD

CROSS-REFERENCE TO RELATED PATENT APPLICATION

This U.S. non-provisional patent application claims priority under 35 U.S.C. §119 of Japanese Patent Application No. 2008-014529, filed on Jan. 25, 2008, in the Japanese Patent Office, the entire contents of which are hereby incorporated by reference.

BACKGROUND OF THE INVENTION

1. Field of the Invention

The present invention relates to a substrate processing apparatus and a substrate processing method for processing a semiconductor substrate or a glass substrate.

2. Description of the Prior Art

A substrate processing apparatus accommodates a substrate (wafer) to be processed inside a reaction chamber, controls a heater to heat the inside of the reaction chamber to a predetermined temperature, supplies gas into the reaction chamber, if necessary, adjusts an internal pressure of a heating furnace, and processes the substrate while rotating a boat which holds the substrate. In the substrate processing apparatus, a Mass Flow Controller (MFC) is installed to adjust and control a flow rate of a reaction gas supplied into the reaction chamber.

However, there may occur a zero point misalignment of the MFC, a malfunction of a flow rate sensor installed inside the MFC, and a malfunction of a valve installed inside the MFC or an actuator for actuating the valve. In this case, since a gas flow rate varies, the processing of the substrate is adversely affected to cause quality, yield and safety problems.

SUMMARY OF THE INVENTION

To solve the above problems, the present invention provides a substrate processing apparatus and a substrate processing method which are capable of detecting malfunctions of mechanisms installed inside MFC.

According to an aspect of the present invention, there is provided a substrate processing apparatus capable of detecting a malfunction thereof, comprising: a process chamber for processing a substrate; a flow rate control unit for controlling a flow rate of a gas supplied into the process chamber; opening-closing valves installed at an upstream side and a downstream side of the flow rate control unit; and a determination unit for determining the flow rate control unit to be malfunctioning when a transition time from a closed state to an open state of the flow rate control unit with all of the opening-closing valves closed exceeds a predefined time.

According to another aspect of the present invention, there is provided a method for detecting a malfunction of a substrate processing apparatus comprising a process chamber for processing a substrate, a flow rate control unit for controlling a flow rate of a gas supplied into the process chamber and opening-closing valves installed in an upstream side and a downstream side of the flow rate control unit, the method comprising steps of: controlling the flow rate control unit to make a transition from a closed state to an open state with all of the opening-closing valves closed; determining the flow rate control unit to be malfunctioning when a transition time from the closed state to the open state exceeds a predefined time; and determining the flow rate control unit to be normally functioning when the transition time is within the predefined time.

BRIEF DESCRIPTION OF THE DRAWINGS

FIG. 5 is a flowchart showing an MFC inspecting process S20 which is performed by the substrate processing apparatus 100.

DETAILED DESCRIPTION OF THE PREFERRED EMBODIMENTS

Figure 1:
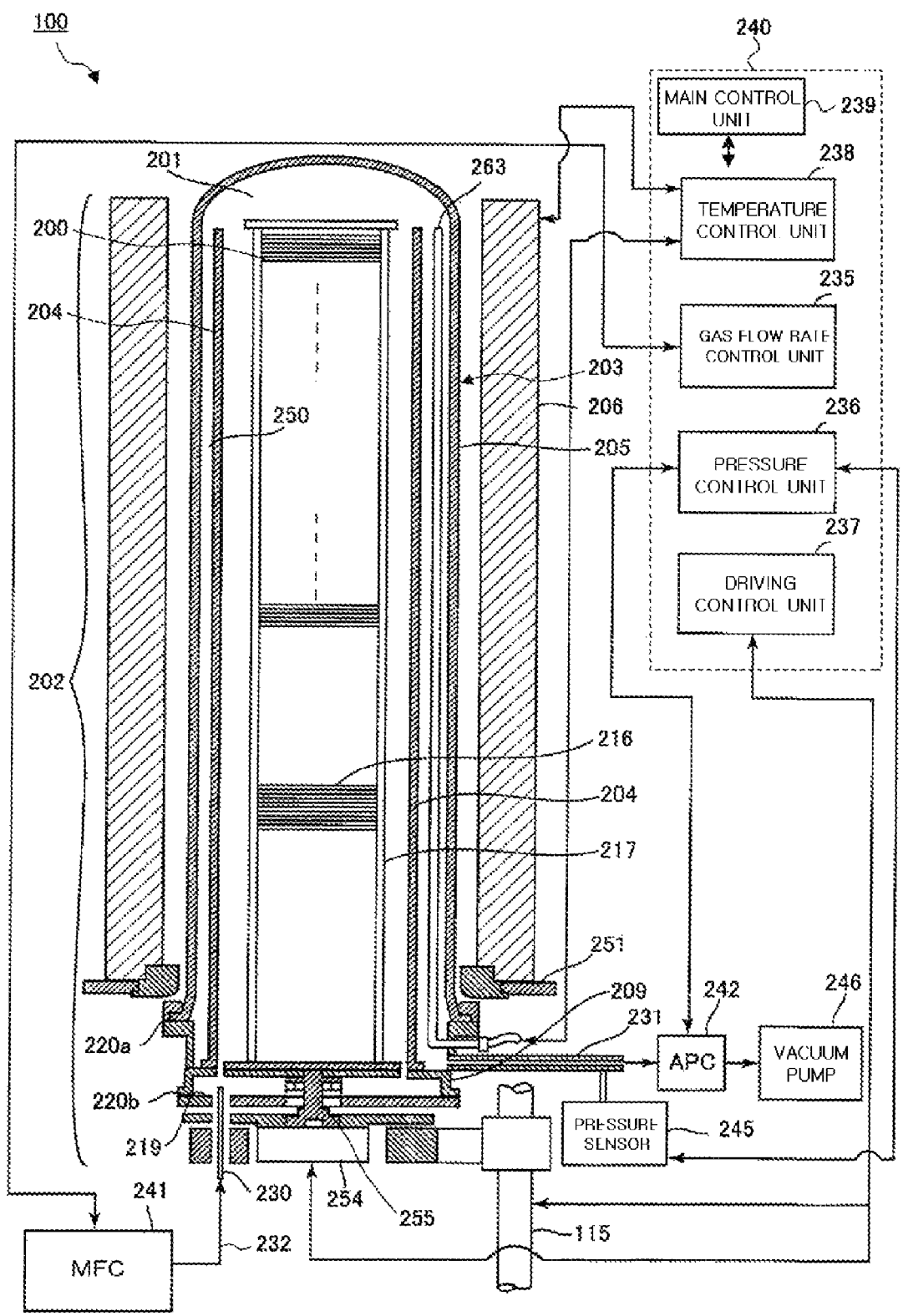
FIG. 1 is a vertical cross-sectional view illustrating the structure of a substrate processing apparatus 100 in accordance with an embodiment of the present invention.

FIG. 1 is a vertical cross-sectional view illustrating the structure of a substrate processing apparatus 100 in accordance with an embodiment of the present invention.

As illustrated in FIG. 1, a processing furnace 202 includes a heater 206 as a heating mechanism. The heater 206 is formed in a cylindrical shape and is supported by a heater base 251 as a holding plate, so that the heater 206 is installed vertically.

At the inside of the heater 206, a process tube 203 as a reaction tube is installed coaxially with the heater 206. The process tube 203 includes an inner tube 204 as an inner reaction tube, and an outer tube 205 as an outer reaction tube which is installed outside the inner tube 204. The inner tube 204 is made of a heat-resistant material such as quartz ($SiO_2$) or silicon carbide (SiC), and is formed in a cylindrical shape with its upper and lower parts opened. At the inside of the cylindrical hollow part of the inner tube 204, a process chamber 201 is formed so that it accommodates a plurality of wafers (substrates) 200 which are arranged at a horizontal position in a vertical direction along multiple stages by a boat 217 as described later. The outer tube 205 is made of a heat-resistant material such as quartz or silicon carbide. An inner diameter of the outer tube 205 is greater than an outer diameter of the inner tube 204, and the outer tube 205 is formed in a cylindrical shape with an upper part closed and a lower part opened. The outer tube 205 is installed coaxially with the inner tube 204.

At the lower part of the outer tube 205, a manifold 209 is installed coaxially with the outer tube 205. The manifold 209 is made of a material such as a stainless steel and is formed in a cylindrical shape with its upper and lower parts opened. The manifold 209 is coupled to the inner tube 204 and the outer tube 205 and is installed to support them. In addition, an O-ring 220a as a seal member is installed between the manifold 209 and the outer tube 205. The manifold 209 is supported on a heater base 251, so that the process tube 203 is installed vertically. A reaction vessel is configured by the process tube 203 and the manifold 209.

At a seal cap 219, which will be described later, a nozzle 230 as a gas introduction unit is connected to communicate with the inside of the process chamber 201, and a gas supply pipe 232 is connected to the nozzle 230. At the upstream part which is opposite to the connection part between the gas supply pipe 232 and the nozzle 230, a process gas supply source (not shown) or an inert gas supply source (not shown) are connected through Mass Flow Controllers (MFC) 241 as gas flow rate controllers. A gas flow rate control unit 235 is electrically connected to the MFC 241 and is configured to control a timing to make gas flow at a desired flow rate.

At the manifold 209, an exhaust pipe 231 for exhausting an atmosphere inside the process chamber 201 is installed. The exhaust pipe 231 is installed at a lower part of a cylindrical space 250 formed by the gap between the inner tube 204 and the outer tube 205, and communicates with the cylindrical space 250. At the downstream part which is opposite to the connection part between the exhaust pipe 231 and the manifold 209, a vacuum exhaust device (vacuum pump) 246 is connected through a pressure sensor 245 as a pressure detector and a pressure control device (APC) 242 and is configured to evacuate the process chamber 201 in order that the pressure inside the process chamber 201 has a predetermined level (vacuum degree). A pressure control unit 236 is electrically connected to the pressure control device 242 and the pressure sensor 245 and is configured to control the pressure control device 242 at a predetermined timing in order to make the pressure inside the process chamber 201 to a desired level, based on the pressure detected by the pressure sensor 245.

At the lower part of the manifold 209, the seal cap 219 is installed as a furnace throat lid which can air-tightly close the lower opening of the manifold 209. The seal cap 219 is configured to contact the lower part of the manifold 209 from a vertically lower side. The seal cap 219 is made of a metal such as a stainless steel and is formed in a disk shape. On the seal cap 219, an O-ring 220b as a seal member is installed to contact the lower part of the manifold 209. At the side which is opposite to the process chamber 201 of the seal cap 219, a rotating mechanism 254 for rotating a boat is installed. A rotation shaft 255 of the rotating mechanism 254 passes through the seal cap 219 and is connected to the boat 217 which will be described later. The rotating mechanism 254 is configured to rotate the boat 217 so that a wafer 200 is rotated. The seal cap 219 is configured so that it is moved in a vertical direction by a boat elevator 115 as an elevating mechanism installed vertically in the outside of the process tube 203, and thus, the boat 217 can be loaded into or unloaded from the process chamber 201. A driving control unit 237 is electrically connected to the rotating mechanism 254 and the boat elevator 115 and is configured so that a desired operation is controlled at a desired timing.

The boat 217 as a substrate holing mechanism is made of a heat-resistant material such as quartz or silicon carbide, and is configured to hold a plurality of wafers 200 at a horizontal position, with their centers aligned, in multiple stages. Furthermore, at the lower part of the boat 217, a plurality of heat insulation plates 216 as disk-shaped heat insulation members made of a heat-resistant material such as quartz or silicon carbide are arranged at a horizontal position in multiple stages and are configured to make it difficult to transfer heat from the heater 206 toward the manifold 209.

At the inside of the process tube 203, a temperature sensor 263 as a temperature detector is installed. A temperature control unit 238 is electrically connected to the heater 206 and the temperature sensor 263, and is configured to control an electrified state of the heater 206, based on temperature information detected by the temperature sensor 263, to control a desired timing in order that temperature inside the processing chamber 201 is made to have a desired temperature distribution.

The gas flow rate control unit 235, the pressure control unit 236, the driving control unit 237, and the temperature control unit 238 constitute a manipulation unit and an input/output unit, and are electrically connected to a main control unit 239 which controls an overall operation of the substrate processing apparatus 100. The main control unit 239 includes a CPU (not shown), a memory (not shown) and a storage device of a hard disk driver (not shown), and executes a predetermined program and inputs/outputs signals to/from the respective control units. The gas flow rate control unit 235, the pressure control unit 236, the driving control unit 237, the temperature control unit 238, and the main control unit 239 controlling these control units are configured as a controller 240.

Figure 2:
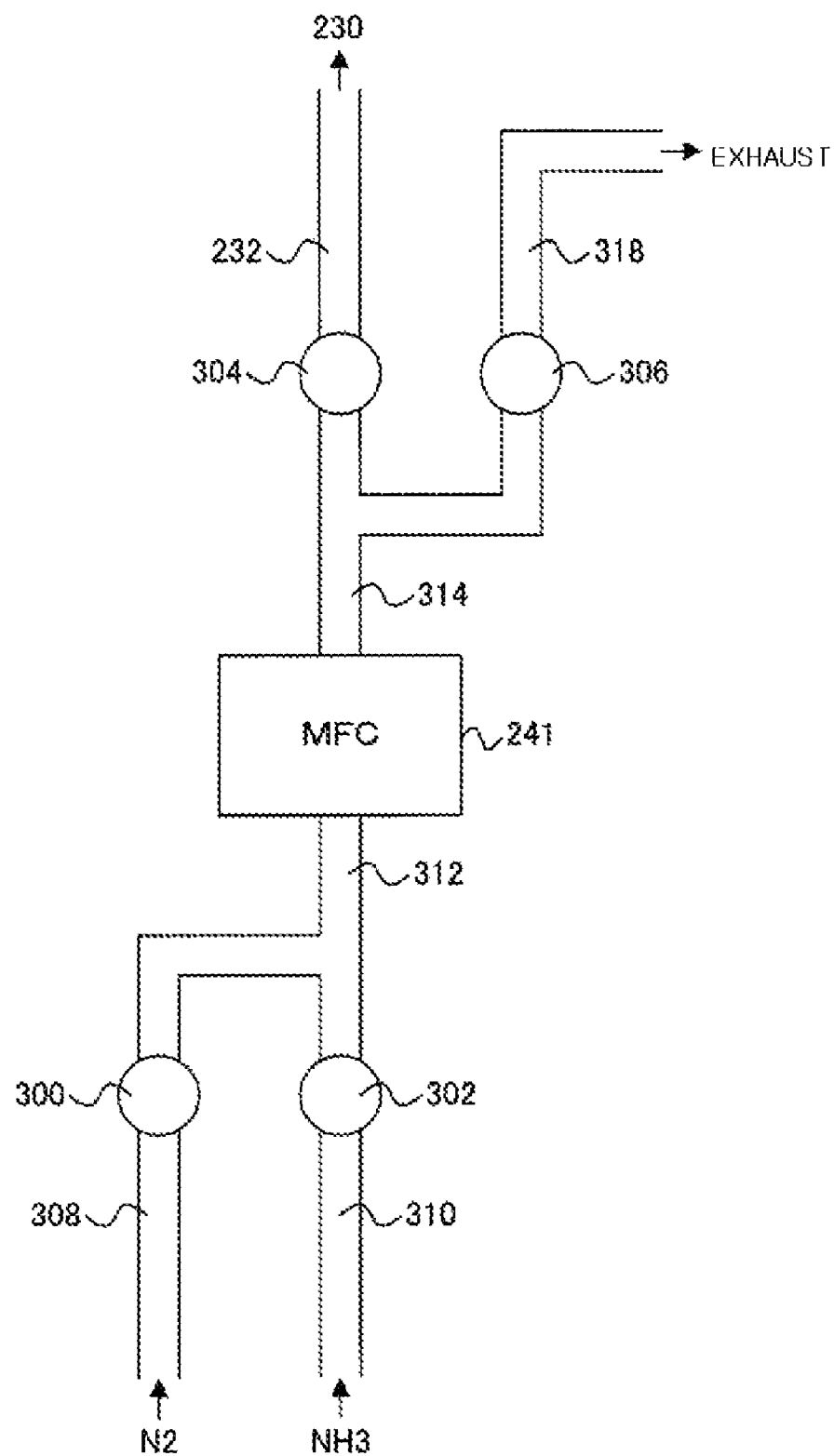
FIG. 2 illustrates the relation of an MFC 241, opening-closing valves installed in an upstream side and a downstream side of the MFC 241, and a gas flow.

FIG. 2 illustrates the relation of the MFC 241, the opening-closing valves (a first shut-off valve 300 to a fourth shut-off valve 306) installed in the upstream side and the downstream side of the MFC 241, and the gas flow.

As illustrated in FIG. 2, an inert gas supply line 308 for supplying an inert gas (for example, $N_2$), a first shut-off valve 300 for shutting off the supply of the inert gas, a process gas supply line 310 for supplying a process gas (for example, $NH_3$), a second shut-off valve 302 for shutting off the supply of the process gas, and an upstream-side gas supply line 312 for supplying a mixture of the inert gas and the process gas to the MFC 241 are installed at the upstream side of the MFC 241.

A gas supply pipe 232 connected to the process chamber 210 through the nozzle 230 (FIG. 1), a third shut-off valve 304 for shutting off the supply of gas to the gas supply pipe 232, an exhaust vent line 318 which is exhaustible without passing through the processing chamber 301, a fourth shut-off valve 306 for shutting off the supply of gas to the exhaust vent line 318, and a downstream-side gas branch line 314 for branching the gas supply line into the gas supply pipe 232 and the exhaust vent line 318 between the MFC 241 and the third shut-off valve 304 and between the MFC 241 and the fourth shut-off valve 306 are installed at the downstream side of the MFC 241.

The MFC 241, the first shut-off valve 300, the second shut-off valve 302, the third shut-off valve 304, and the fourth shut-off valve 306 are connected to the gas flow rate control unit 235. The gas flow rate control unit 235 controls the opening and closing of the first to fourth shut-off valves 300 to 306. Furthermore, the gas flow rate control unit 235 controls the opening and closing of a control value installed inside the MFC 241 as described later. The gas flow in those components is controlled by the gas flow rate control unit 235.

Figure 3:
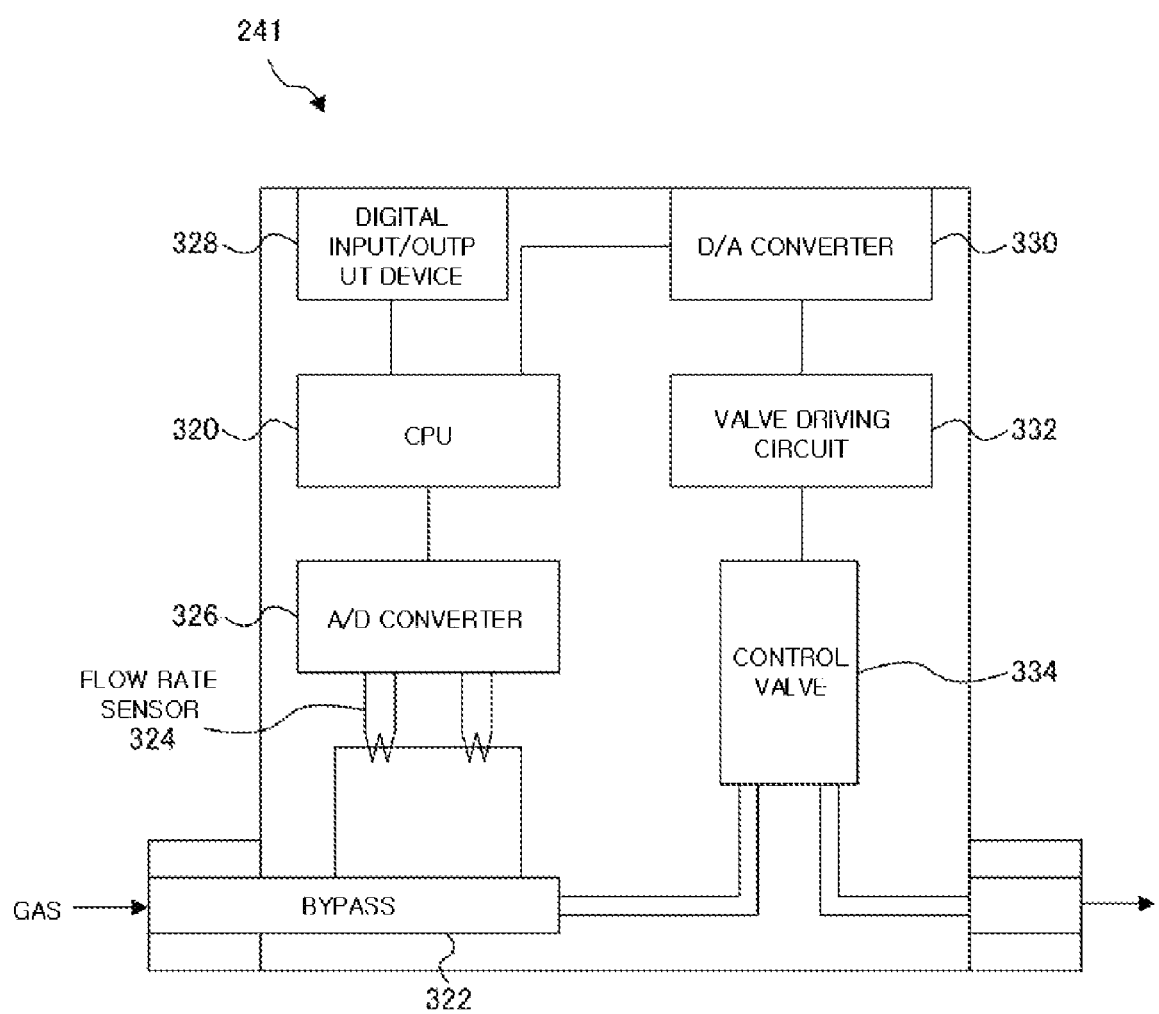
FIG. 3 illustrates the detailed internal structure of the MFC 241.

FIG. 3 illustrates the detailed internal structure of the MFC 241.

As illustrated in FIG. 3, a bypass 322, a control valve 334 for controlling a flow rate of gas supplied through the bypass 322, a valve driving circuit 332 including an actuator for driving the control valve 334 based on an output of a D/A converter 330 as described later, a flow rate sensor 324 for detecting a flow rate of gas supplied to the bypass 322, an A/D converter 326 for analog-to-digital converting the gas flow rate detected by the flow rate sensor 324, a CPU 320 for receiving an output of the A/D converter 326 and controlling the components inside the MFC 241, a digital input/output device 328 for inputting/outputting digital signals to/from an external computer of the MFC 241, and the D/A converter 330 for digital-to-analog converting an output signal of the CPU 320 are installed inside the MFC 241.

The MFC 241 controls a flow rate of gas supplied into the process chamber 201 by means of those components, and constitutes a flow rate control unit. The flow rate control unit is also called a flow rate controller. In the MFC 241, the CPU 320 outputs a gas flow rate inside the MFC 241 through the digital input/output device 328 to the external computer (for example, the main control unit 239). The gas flow rate is detected as a voltage value corresponding to an actual gas flow rate, and the detected voltage value is output. Furthermore, the CPU 320 compares the voltage value output from the flow rate sensor 324 with a flow rate setting voltage value which is a control signal output from the external computer through the digital input/output device 328, and controls the opening and closing of the control valve 334 through the valve driving circuit 332 in order that the voltage value output from the flow rate sensor 324 becomes equal to the flow rate setting voltage value.

Figure 4:
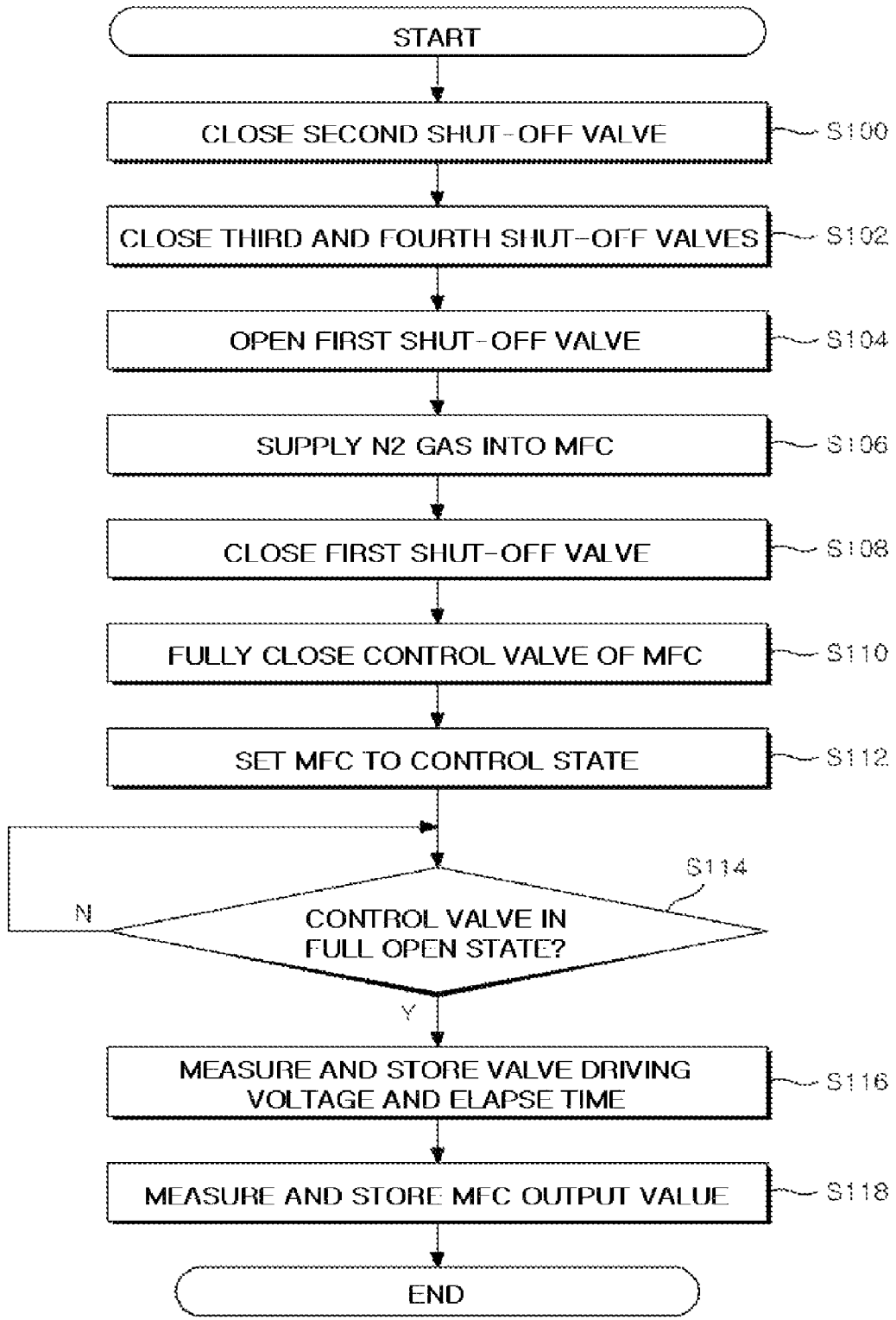
FIG. 4 is a flowchart showing a reference point checking process S10 which is performed by the substrate processing apparatus 100.

FIG. 4 is a flowchart showing a reference point checking process S10 which is performed by the substrate processing apparatus 100. The reference point checking process is performed before the processing of the substrate.

As illustrated in FIG. 4, in the step S100, the main control unit 239 of the substrate processing apparatus 100 controls the gas flow rate control unit 235, and the second shut-off valve 302 is closed by controlling the gas flow rate control unit 235. In addition, the subsequent valve opening/closing operation and gas supply operation are controlled in the above manner.

In the step S102, the third shut-off valve 304 and the fourth shut-off valve 306 are closed.

In the step S104, the first shut-off valve 300 is opened.

In the step S106, $N_2$ gas as the inert gas is supplied into the MFC 241 so that the MFC 241 is filled with the inert gas.

In the step S108, the first shut-off valve 300 is closed. That is, the first shut-off valve 300, the second shut-off valve 302, the third shut-off valve 304 and the fourth shut-off valve 306 are closed.

In the step S110, the control valve 334 inside the MFC 241 becomes a fully closed state.

In the step S112, the main control unit 239 controls the gas flow rate control unit 235 so that the MFC 241 is set to a control state. That is, since the first to fourth shut-off valves are in the closed state, the control valve 334 inside the MFC 241 maintains a fully closed state. In this state, since the state of the MFC 241 cannot be determined, the MFC 241 is forcibly set to a control state. Specifically, the control valve 334 inside the MFC 241 is opened over a predefined time at a predetermined voltage value (that is, predetermined speed). Preferably, the control valve 334 is controlled by the gas flow rate control unit 235 so that it becomes a fully open state over more than 10 seconds.

In the step S114, the main control unit 239 determines whether the control valve 334 is in a fully open state or not. The main control unit 239 performs the step S116 when the control valve 334 is in the fully open state, and returns to the step S114 when the control valve 334 is not in the fully open state.

In the step S116, a valve driving voltage of the valve driving circuit and an elapse time taken until the control valve 334 transits from the fully closed state to the fully open state are measured. The valve driving voltage is a voltage which is required to open the valve, and is called a valve opening degree. The main control unit 239 stores the valve driving voltage and the elapse time in a memory (not shown) or a storage device (not shown) of a hard disk drive.

In the step S118, the gas flow rate is measured by the gas flow rate sensor 324 and is output as a voltage value corresponding to the actual gas flow rate from the MFC 241 to the main control unit 239. The gas flow rate is a value (for example, 1 mV) detected when the control valve 334 is in the fully open state. The main control unit 239 stores the detected value in the storage device. Also, the voltage value measured by the gas flow rate sensor 324 and output from the MFC 241 to the main control unit 239 is called an MFC output value.

The main control unit 239 uses the stored MFC output value M1, the valve driving voltage V1, and the elapse time T1 as reference values. Furthermore, the main control unit 239 sets threshold values of the MFC output value, the valve driving voltage and the elapse time, based on the reference values. For example, the main control unit 239 sets values subtracted from or added to the reference values as the threshold values. The threshold values are used in an MFC inspection process as described later. By using the threshold values, the reference value as an absolute value, the reference value as a relative value corresponding to the individual MFC states, and the threshold value are possible. That is, the reference value and the threshold value can be modified according to the state variation of the elapse time of the MFC.

FIG. 5 is a flowchart showing the MFC inspecting process S20 which is performed by the substrate processing apparatus 100. The MFC inspection process is performed after a predetermined number (batch number) of the substrate processing is performed, or after a predefined time elapses from the previous substrate processing. Preferably, the MFC inspection process is performed before the next substrate processing is initiated.

As illustrated in FIG. 5, in the step S200, the valve driving voltage V1 and the elapse time T1 are measured in the same manner as the reference point checking process S10. The measured valve driving voltage V1 and elapse time T1 are output to the main control unit 239.

In the step S201(a), the main control unit 239 compares the measured valve driving voltage V1 with the threshold value and determines whether the valve driving voltage V1 exceeds the threshold value or not. The main control unit 239 performs the step S201(b) when the valve driving voltage V1 exceeds the threshold value, and performs the step S202 when the valve driving voltage V1 does not exceed the threshold value.

In the step S201(b), the main control unit 239 determines the valve driving circuit 332 installed in the MFC 241 to be malfunctioning.

In addition, when the valve driving circuit 332 malfunctions, the valve driving voltage V1 out of the control range may be applied to the control valve 334. That is, although there are individual differences, the control valve 334 becomes to be in an uncontrollable state, for example, a fully open state, so that tens times (multiple times) of a flow rate compared to an upper limit of a control flow rate is introduced. In this case, the processing of the substrate may be adversely affected, or accidents such as electrostatic discharge, explosion and leakage out of the device may be caused. The main control unit 239 performs a malfunction notifying process by displaying a warning message that informs the malfunction of the valve driving circuit 332 on a display device (not shown) of the controller 240, and generating a warning sound. Furthermore, the main control unit 239 stores the detected valve driving voltage V1 in the storage device. Moreover, the main control unit 239 finishes the MFC inspection process S20 and changes to the state where the substrate processing process of the substrate processing apparatus 100 is inhibited.

On the other hand, in the step S202, the main control unit 239 compares the measured elapse time T1 with the threshold value and determines whether the elapse time T1 exceeds the threshold value or not. The main control unit 239 performs the step S204 when the elapse time T1 exceeds the threshold value, and performs the step S206 when the elapse time T1 does not exceed the threshold value.

In the step S204, the main control unit 239 determines the control valve 334 installed in the MFC 241 to be malfunctioning. That is, the main control unit 239 serves as a determination unit to determine the MFC 241 to be malfunctioning when a transition time from a closed state to an open state of the control valve 334 of the MFC 241 with the first to fourth shut-off valves 300 to 306 closed exceeds a predefined time (threshold value). Furthermore, if the transition time exceeds the threshold value, the control valve 334 is determined to be degrading as time elapses. In this case, since the malfunctioning gas flow rate controller cannot be perform normally, the MFC inspection process S20 is carried out.

The main control unit 239 performs a malfunction notifying process by displaying a warning message on a display device (not shown) of the controller 240 and generating a warning sound. Furthermore, the main control unit 239 stores the detected elapse time T1 in the storage device.

In the step S206, when the control valve 334 is in a fully open state, the MFC output value is measured. The MFC output value is output from the MFC 241 to the main control unit 239. The main control unit 239 calculates a difference value e1 between the measured MFC output value and the stored reference value M1 and stores the calculated difference value e1 in the storage device. The measurement of the MFC output value and the calculation of the difference value e1 are performed for a predefined time T2.

In the step S208, the main control unit 239 compares the calculated difference value e1 with the threshold value. When at least a portion of the calculated difference value e1 exceeds the threshold value for time T2, the main control unit 239 performs the step S210. When any portion of the difference value e1 does not exceed the threshold value, the main control unit 239 determines that the difference value e1 is not deviated from the zero point, and displays and notifies it on the display device, and finishes the process. Furthermore, in this case, if the accumulated value of the difference value e1 exceeds a predetermined value, the main control unit 239 may perform the step S210.

In the step S210, the main control unit 239 determines whether the state where the difference value e1 exceeds the threshold value is continued even after time T2 or not. If the state is continued, the main control unit 239 performs the step S212. If the state is not continued, the main control unit 239 determines that the state where the difference value e1 exceeds the threshold value is an unexpected state and the state is already recovered to the normal state, and finishes the process.

In the step S212, the main control unit 239 performs a zero point correction process. Specifically, the process is performed by adding the calculated difference value e1 as a correction value to the reference value M1.

In the step S214, the main control unit 239 stores the difference value e1 in the storage device.

In this way, the MFC inspection process detects the malfunction of the MFC 241, detects the zero point misalignment of the MFC 241, and performs the correction process.

The embodiment of the present invention has at least one of the following effects.

1) The substrate processing apparatus 100 in accordance with the embodiment of the present invention can detect the malfunction of the mechanisms installed inside the MFC 241. Furthermore, if the malfunction is not detected, the substrate processing apparatus 100 determines the MFC 241 as being normal, and processes the substrate. Therefore, the substrate processing apparatus 100 can maintain the quality of the substrate and prevent the lowering of the yield, without adversely affecting the substrate processing.

2) In the reference point checking process and the MFC inspection process, since only the inert gas is used while the process gas is not used, the substrate processing apparatus 100 can maintain the safety. If the malfunction is detected, a predetermined warning is given and thus the operator can easily check the repair and exchange period.

3) By measuring the valve driving voltage of the flow rate control unit and comparing the measured valve driving voltage with the valve driving voltage which is the previously set reference value, it is possible to detect the malfunction of the valve driving circuit and prevent the adverse influence on the substrate processing and the accidents electrostatic discharge, explosion and leakage out of the device.

4) By measuring the elapse time taken until the control value of the flow rate control unit changes from the fully closed state to the fully open state and comparing the measured elapse time with the elapse time which is a previously set reference value, it is possible to detect the malfunction of the control valve and check the degraded state of the control valve, and the recent process can be performed without inhibition.

5) By measuring the output value in a state that the flow rate control unit is in the fully open state and comparing the measured output value with the output value which is a previously set reference value, the malfunction of the zero point can be detected. Furthermore, by adding the difference value obtained from the comparison as a correction value to the reference value, it is possible to perform the zero-point correction process and the accurate flow rate control.

6) By performing the above-described inspection process S20, the malfunction of the valve driving circuit of the flow rate control unit, the malfunction of the control valve, and the malfunction of the zero point can be determined by one-time inspection process, and the running cost can be reduced.

In the MFC 241, the digital input/output device 328 is installed. Therefore, the MFC 241 can input/output digital signals from/to the main control unit 239. For this reason, the A/D converter and the D/A converter are unnecessary between the MFC 241 and the main control unit 239.

Furthermore, the main control unit 239 outputs the digital signals to the MFC 241, the first shut-off valve 300, the second shut-off valve 302, the third shut-off valve 304, and the fourth shut-off valve 306. Therefore, the main control unit 239 can control those components by using digital communication. Moreover, although it has been described in the above embodiment that the digital input/output device 328, the A/D converter and the D/A converter are accommodated inside the MFC 241, the A/D converter and the D/A converter can be installed outside the MFC 241 by installing an analog input/output device inside the MFC 241, without installing the digital input/output device 328, the A/D converter or the D/A converter. This case is inferior to the above-described embodiment because the A/D converter and the D/A converter are required between the MFC 241 and the main control unit 239, but can have the same effects.

(Supplementary Note)

The present invention includes the following embodiments.

(Supplementary Note 1)

According to an embodiment of the present invention, there is provided a substrate processing apparatus capable of detecting a malfunction thereof, comprising: a process chamber for processing a substrate; a flow rate control unit for controlling a flow rate of a gas supplied into the process chamber; an opening-closing valve installed at an upstream side and a downstream side of the flow rate control unit; and a determination unit for determining the flow rate control unit to be malfunctioning when a transition time from a closed state to an open state of the flow rate control unit with the opening-closing valve closed exceeds a predefined time.

(Supplementary Note 2)

It is preferable that the determination unit determines that the flow rate control unit is abnormal if a voltage for setting the flow rate control unit to an open state exceeds a previously set voltage when the flow rate control unit transits from a closed state to an open state while the opening-closing valve is in a closed state.

(Supplementary Note 3)

It is preferable that the determination unit determines that the flow rate control unit is abnormal when an output value of the flow rate control unit exceeds a previously set value in an open state.

(Supplementary Note 4)

It is preferable that the flow rate control unit supplies an inert gas when at least one opening-closing valve installed in the upstream side is in an open state, and the determination unit performs the determination when the opening-closing valve is in a closed state.

(Supplementary Note 5)

According to another embodiment of the present invention, there is provided a method for detecting a malfunction of a substrate processing apparatus comprising a process chamber for processing a substrate, a flow rate control unit for controlling a flow rate of a gas supplied into the process chamber and an opening-closing valve installed in an upstream side and a downstream side of the flow rate control unit, the method comprising steps of: controlling the flow rate control unit to make a transition from a closed state to an open state with the opening-closing valve closed; determining the flow rate control unit to be malfunctioning when a transition time from the closed state to the open state exceeds a predefined time; and determining the flow rate control unit to be normally functioning when the transition time is within the predefined time.

(Supplementary Note 6)

According to another embodiment of the present invention, there is provided a substrate processing method, including: transiting a flow rate control unit from a closed state to an open state when an opening-closing valve installed in an upstream side and a downstream side of the flow rate control unit, which controls a flow rate of gas supplied into a process chamber for processing a substrate, is in a closed state; determining that the flow rate control unit is abnormal when a voltage for setting the flow rate control unit to an open state exceeds a previously set voltage; and determining that the flow rate control unit is normal when the voltage for setting the flow rate control unit to the open state is lower than the previously set voltage.

What is claimed is:

1. A substrate processing apparatus capable of detecting a malfunction thereof, comprising:
    a process chamber for processing a substrate;
    a flow rate control unit for controlling a flow rate of a gas supplied into the process chamber;
    opening-closing valves installed at an upstream side and a downstream side of the flow rate control unit; and
    a determination unit for determining the flow rate control unit is malfunctioning when a transition time from a closed state of the flow rate control unit to an opened state of the flow rate control unit, with all of the opening-closing valves closed, exceeds a predefined time.

2. A method for detecting a malfunction of a substrate processing apparatus, the substrate processing apparatus comprising a process chamber, a flow rate control unit, and opening-closing valves installed at an upstream side and a downstream side of the flow rate control unit, the method comprising:
    processing, by the process chamber, a substrate;
    controlling the flow rate control unit to transition from a closed state to an opened state, with all of the opening-closing valves closed;
    determining that the flow rate control unit is malfunctioning when a transition time from the closed state to the opened state exceeds a predefined time; and
    determining that the flow rate control unit is functioning normally when the transition time is within the predefined time.

* * * * *